United States Patent
Peck et al.

(10) Patent No.: US 10,882,158 B2
(45) Date of Patent: Jan. 5, 2021

(54) PEENING COATED INTERNAL SURFACES OF TURBOMACHINE COMPONENTS

(71) Applicant: General Electric Company, Schenectady, NY (US)

(72) Inventors: Arthur S. Peck, Greenville, SC (US); Gabriel DellaFera, Greenville, SC (US); Paul Stephen Dimascio, Greenville, SC (US); Jon Conrad Schaeffer, Greenville, SC (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 16/260,768

(22) Filed: Jan. 29, 2019

(65) Prior Publication Data
US 2020/0238475 A1 Jul. 30, 2020

(51) Int. Cl.
*B24C 1/10* (2006.01)
*B24C 1/04* (2006.01)
(Continued)

(52) U.S. Cl.
CPC .......... *B24C 1/10* (2013.01); *B24C 1/04* (2013.01); *C23C 16/303* (2013.01); *C23C 16/56* (2013.01); *F01D 5/286* (2013.01); *F05D 2230/20* (2013.01); *F05D 2230/314* (2013.01); *F05D 2300/175* (2013.01)

(58) Field of Classification Search
CPC . B05D 3/007; B05D 3/12; B05D 7/22; B05D 2259/00; C23C 10/00; C23C 10/04; C23C 10/48; C23C 10/50; C23C 10/60; C23C 16/00; C23C 16/04; C23C 16/042; C23C 16/045; C23C 16/12; C23C 16/20; C23C 16/56; B24C 1/04; B24C 1/10; C21D 7/06; C21D 2221/00; C22F 1/04;
(Continued)

(56) References Cited

U.S. PATENT DOCUMENTS 1,833,025 A 11/1931 Langenberg
2,439,032 A * 4/1948 Almen .............. B24C 5/04
451/102

(Continued)

FOREIGN PATENT DOCUMENTS

EP 1077109 A2 2/2001
GB 1145147 A 3/1969
WO WO-2013101921 A2 * 7/2013 ............. C23C 4/01

OTHER PUBLICATIONS

Kanchidurai, S.; Krishanan, P. A.; Baskar, K.; Mohan, K. S. R. A Review of Inducing Compressive Residual Stress—Shot Peening; on Structural Metal and Welded Connection. IOP Conference Series: Earth and Environmental Science 2017, 80, 012033. (Year: 2017).*

*Primary Examiner* — William P Fletcher, III
(74) *Attorney, Agent, or Firm* — Dority & Manning, P.A.

(57) ABSTRACT

A method of treating a substrate of a turbomachine component includes applying a coating to a surface of the substrate of the turbomachine component and peening the substrate after applying the coating to the surface by directing a peening force onto the coating whereby the peening force on the coating is transferred through the coating to the substrate. A method of treating an internal surface of a turbomachine component includes directing a peening force at the internal surface within a cooling passage of the turbomachine component.

20 Claims, 7 Drawing Sheets

(51) Int. Cl.
*C23C 16/56* (2006.01)
*C23C 16/30* (2006.01)
*F01D 5/28* (2006.01)

(58) Field of Classification Search
CPC .. C22F 1/10; B23P 6/002; B23P 6/045; B23P 2700/01; B23P 2700/06; B23P 2700/13
See application file for complete search history.

(56) References Cited

U.S. PATENT DOCUMENTS

| | | | |
|---|---|---|---|
| 2,460,657 A | 2/1949 | Robinson | |
| 3,160,989 A | 12/1964 | Millhiser | |
| 3,695,091 A * | 10/1972 | Smith | B24C 1/10 73/11.02 |
| 4,258,084 A | 3/1981 | Hayden, Sr. | |
| 4,354,371 A | 10/1982 | Johnson | |
| 6,238,743 B1 * | 5/2001 | Brooks | C23C 4/02 134/2 |
| 6,403,165 B1 * | 6/2002 | Grylls | C23C 4/08 427/456 |
| 6,923,616 B2 * | 8/2005 | McRae, Jr. | F01D 5/187 415/115 |
| 7,063,250 B2 | 6/2006 | Ohara et al. | |
| 7,147,899 B2 * | 12/2006 | Fernihough | C23C 14/042 427/508 |
| 7,644,599 B2 * | 1/2010 | Hoffmann-Ivy | B24C 1/10 72/53 |
| 8,555,965 B2 | 10/2013 | Roy et al. | |
| 8,578,745 B2 * | 11/2013 | Berndt | F01D 5/286 72/53 |
| 9,109,279 B2 | 8/2015 | Chandra et al. | |
| 10,202,855 B2 | 2/2019 | Nagaraj et al. | |
| 2006/0021410 A1 * | 2/2006 | Cheppe | C21D 7/06 72/53 |
| 2008/0241546 A1 * | 10/2008 | McClain | C21D 10/005 428/409 |
| 2012/0276308 A1 * | 11/2012 | Rebak | F01D 5/184 428/34.1 |
| 2014/0251951 A1 * | 9/2014 | Hunt | C23C 18/1619 216/41 |
| 2015/0017475 A1 | 1/2015 | Ward-Close | |
| 2016/0053618 A1 * | 2/2016 | Bunker | B23P 15/04 428/34.1 |

\* cited by examiner

PEENING COATED INTERNAL SURFACES OF TURBOMACHINE COMPONENTS

FIELD

The present disclosure generally involves methods of treating a surface of a turbomachine component. In particular, the present disclosure provides methods of peening a coated surface, such as an internal surface, of the turbomachine component.

BACKGROUND

Turbine systems are widely utilized in fields such as power generation. For example, a conventional gas turbine includes a compressor section, a combustor section, and at least one turbine section. The compressor section is configured to compress air as the air flows through the compressor section. The air is then flowed from the compressor section to the combustor section, where it is mixed with fuel and combusted, generating a hot gas flow. The hot gas flow is provided to the turbine section, which utilizes the hot gas flow by extracting energy from it to power the compressor, an electrical generator, and other various loads.

During operation of a turbine system or turbomachine, the various components of the turbomachine endure various forms of wearing. Such wearing can lead to damage and/or failure of the individual components and the turbomachine in general. Rotor components, which rotate during operation of the turbomachine, are particularly susceptible to wearing. For example, present rotor components may be expected to operate for approximately 150,000 hours and 5,000 starts. Further, in many cases, specific wear sensitive locations on the components, such as on the rotor components, may tend to wear faster than other locations. These wear sensitive locations may limit the lives of the associated rotor components.

Various techniques have been used for attempting to modify the wear characteristics of turbomachine components, and in particular of rotor components. For example, powder pack deposition techniques have been utilized to coat exterior surfaces of rotor components. However, such techniques are difficult to perform during in-field service repairs, and cause component distortion issues. Further, the coatings can be relatively brittle, and can be expensive to replace and/or repair.

Another technique which has been used for attempting to modify the wear characteristics of turbomachine components is peening. Peening is a process which may be used to improve the material properties of a metal, such as a metal material of a turbomachine component. The peening impact, usually created by mechanical means such as a hammer blow or by a blast of shot (e.g., shot peening), plastically deforms the metal surface to produce residual compressive stresses at or below the surface and tensile stresses in the interior. The compressive stresses in the metal surface improves the metal's resistance to metal fatigue and crack growth.

Attempts to combine both techniques, coating and peening, have thus far met with limited success. For example, as mentioned above, the coating material may be relatively brittle, such that the impact forces during peening may impair or damage the coating, such as causing the coating material to spall off of the component. As another example, some coating materials may be too ductile for peening. Such ductile coating materials may resist the impact forces during peening, but also may not transfer such forces to the component itself, preventing or inhibiting the formation of beneficial residual stress in the component. As yet another example, applying the coating after peening may undo some or all of the effects of the peening. For instance, heat from the coating application process may relax the residual stress from the peening.

Thus, improved methods which permit use of both coating and peening to treat a component are desired in the art.

BRIEF DESCRIPTION

Aspects and advantages of the technology are set forth below in the following description, or may be obvious from the description, or may be learned through practice of the technology.

According to one example embodiment, a method of treating a substrate of a turbomachine component is provided. The method includes applying a coating to a surface of the substrate of the turbomachine component and peening the substrate after applying the coating to the surface by directing a peening force onto the coating whereby the peening force on the coating is transferred through the coating to the substrate.

In accordance with another example embodiment, a method of treating a turbomachine component is provided. The method includes directing a peening force at an internal surface of a cooling passage of the turbomachine component.

In accordance with still another example embodiment, a turbomachine component is provided. The turbomachine component includes a substrate and a diffusion aluminide coating on the substrate. The substrate exhibits residual compressive stress from peening.

Those of ordinary skill in the art will better appreciate the features and aspects of such embodiments, and others, upon review of the specification.

BRIEF DESCRIPTION OF THE DRAWINGS

A full and enabling disclosure of the present embodiments, including the best mode thereof to one skilled in the art, is set forth more particularly in the remainder of the specification, including reference to the accompanying figures.

DETAILED DESCRIPTION

Figure 1:
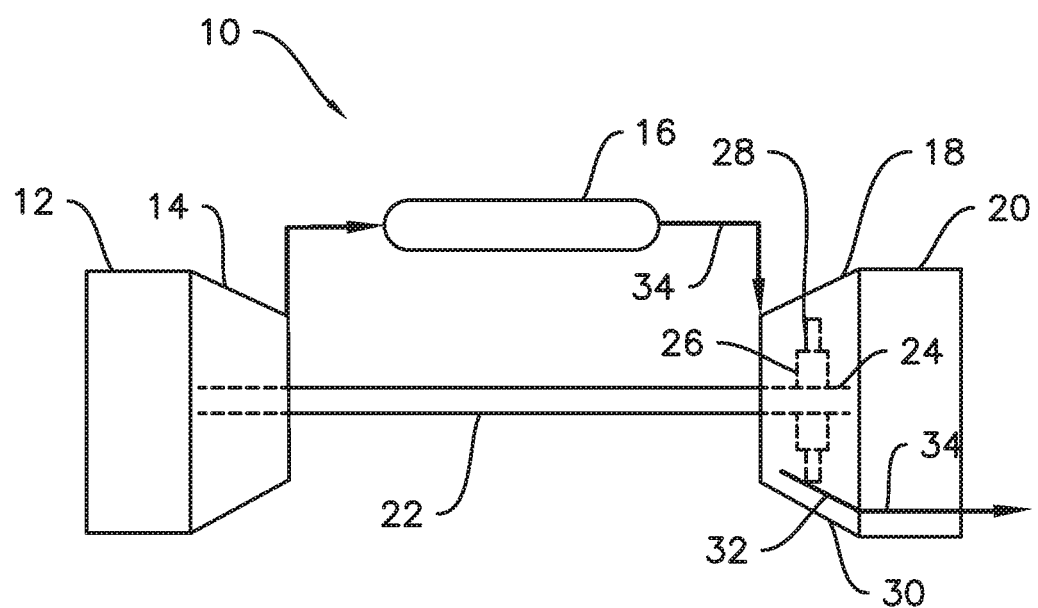
FIG. 1 illustrates a functional diagram of an exemplary gas turbine which may incorporate one or more treated components according to one or more embodiments of the present disclosure.

Reference will now be made in detail to various embodiments, one or more examples of which are illustrated in the accompanying drawings. The detailed description uses numerical and letter designations to refer to features in the drawings. Like or similar designations in the drawings and description have been used to refer to like or similar parts. As used herein, the terms "first," "second," and "third" may be used interchangeably to distinguish one component from another and are not intended to signify location or importance of the individual components. The terms "upstream" or "forward" and "downstream" or "aft" refer to the relative direction with respect to fluid flow in a fluid pathway. For example, "upstream" refers to the direction from which the fluid flows, and "downstream" refers to the direction to which the fluid flows. The term "radially" refers to the relative direction that is substantially perpendicular to an axial centerline of a particular component, and the term "axially" refers to the relative direction that is substantially parallel to an axial centerline of a particular component.

The terms "includes" and "including" as used herein are intended to be inclusive in a manner similar to the term "comprising." Similarly, the term "or" is generally intended to be inclusive (i.e., "A or B" is intended to mean "A or B or both"). Furthermore, it should be appreciated that as used herein, terms of approximation, such as "approximately," "generally," "substantially," or "about," refer to being within a ten percent margin of error. When used in the context of an angle or direction, such terms include within ten degrees greater or less than the stated angle or direction. For example, "generally vertical" includes directions within ten degrees of vertical in any direction, e.g., clockwise or counter-clockwise.

Each example is provided by way of explanation, not limitation. In fact, it will be apparent to those skilled in the art that modifications and variations can be made in the present embodiments without departing from the scope or spirit thereof. For instance, features illustrated or described as part of one embodiment may be used on another embodiment to yield a still further embodiment. Thus, it is intended that the present embodiments cover such modifications and variations as come within the scope of the appended claims and their equivalents. Although exemplary embodiments will be described generally in the context of a land based power generating gas turbine for purposes of illustration, one of ordinary skill in the art will readily appreciate that embodiments may be applied to any type of turbomachine, such as a steam turbine, a marine gas turbine, or aircraft gas turbine, and that embodiments are not limited to land based power generating gas turbine components unless specifically recited in the claims.

Referring now to the drawings, FIG. 1 illustrates a schematic diagram of one embodiment of a gas turbine 10. The gas turbine 10 generally includes an inlet section 12, a compressor section 14 disposed downstream of the inlet section 12, a plurality of combustors (not shown) within a combustor section 16 disposed downstream of the compressor section 14, a turbine section 18 disposed downstream of the combustor section 16 and an exhaust section 20 disposed downstream of the turbine section 18. Additionally, the gas turbine 10 may include one or more shafts 22 coupled between the compressor section 14 and the turbine section 18.

The turbine section 18 may generally include a rotor shaft 24 having a plurality of rotor disks 26 (one of which is shown) and a plurality of rotor blades 28 extending radially outwardly from and being interconnected to each rotor disk 26. Each rotor disk 26 may, in turn, be coupled to a portion of the rotor shaft 24 that extends through the turbine section 18. The turbine section 18 further includes an outer casing 30 that circumferentially surrounds the rotor shaft 24 and the rotor blades 28, thereby at least partially defining a hot gas path 32 through the turbine section 18.

During operation, a working fluid such as air flows through the inlet section 12 and into the compressor section 14 where the air is progressively compressed, thus providing pressurized air to the combustors of the combustion section 16. The pressurized air is mixed with fuel and burned within each combustor to produce hot gases of combustion 34. The hot gases of combustion 34 flow through the hot gas path 32 from the combustor section 16 to the turbine section 18, wherein energy (kinetic and/or thermal) is transferred from the hot gases 34 to the rotor blades 28, thus causing the rotor shaft 24 to rotate. The mechanical rotational energy may then be used, e.g., to power the compressor section 14 and generate electricity. The hot gases of combustion 34 exiting the turbine section 18 may then be exhausted from the gas turbine 10 via the exhaust section 20.

Figure 2:
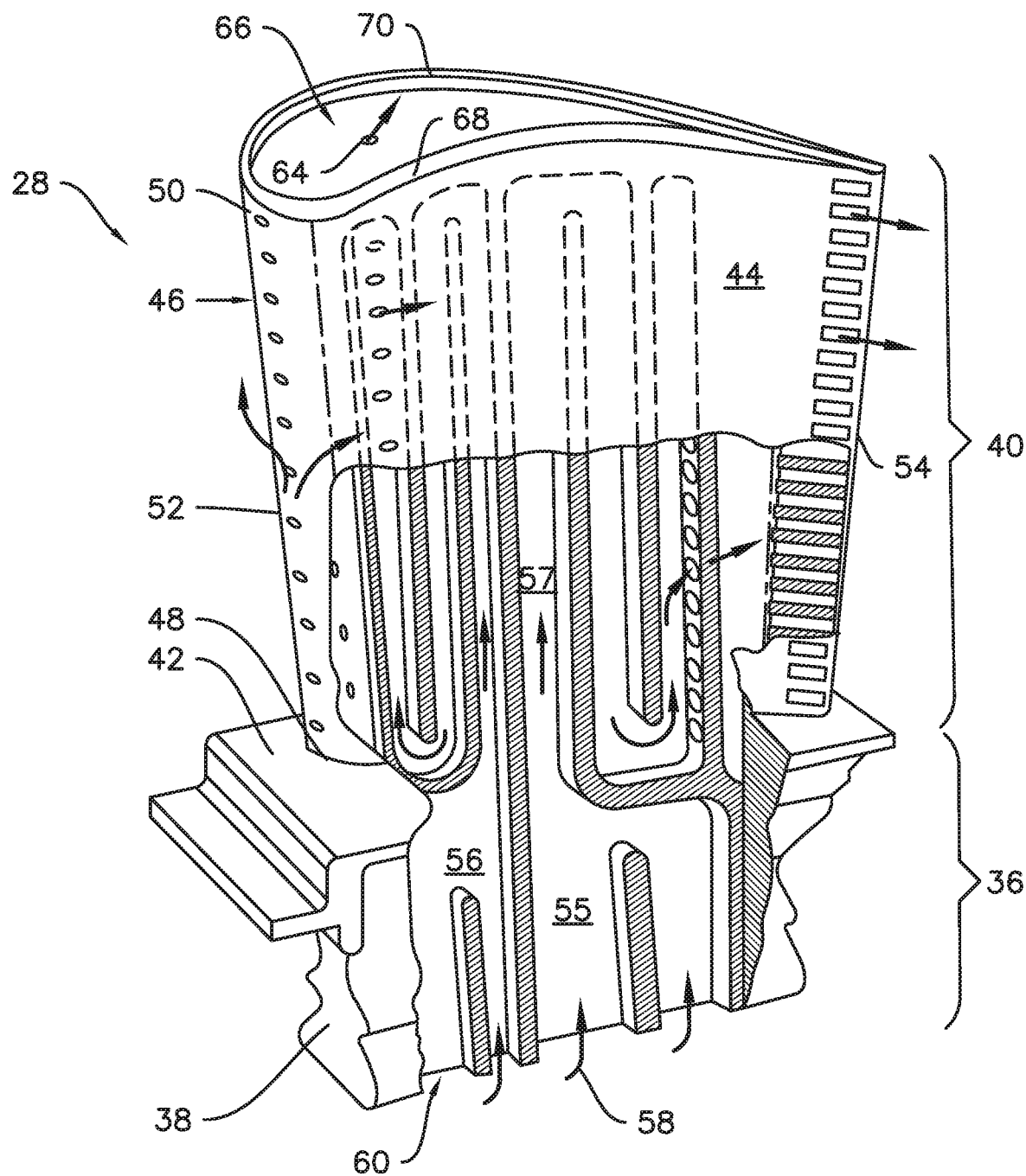
FIG. 2 is a partially cut away perspective view of an exemplary rotor blade as may incorporate various embodiments of the present disclosure.
Figure 3:
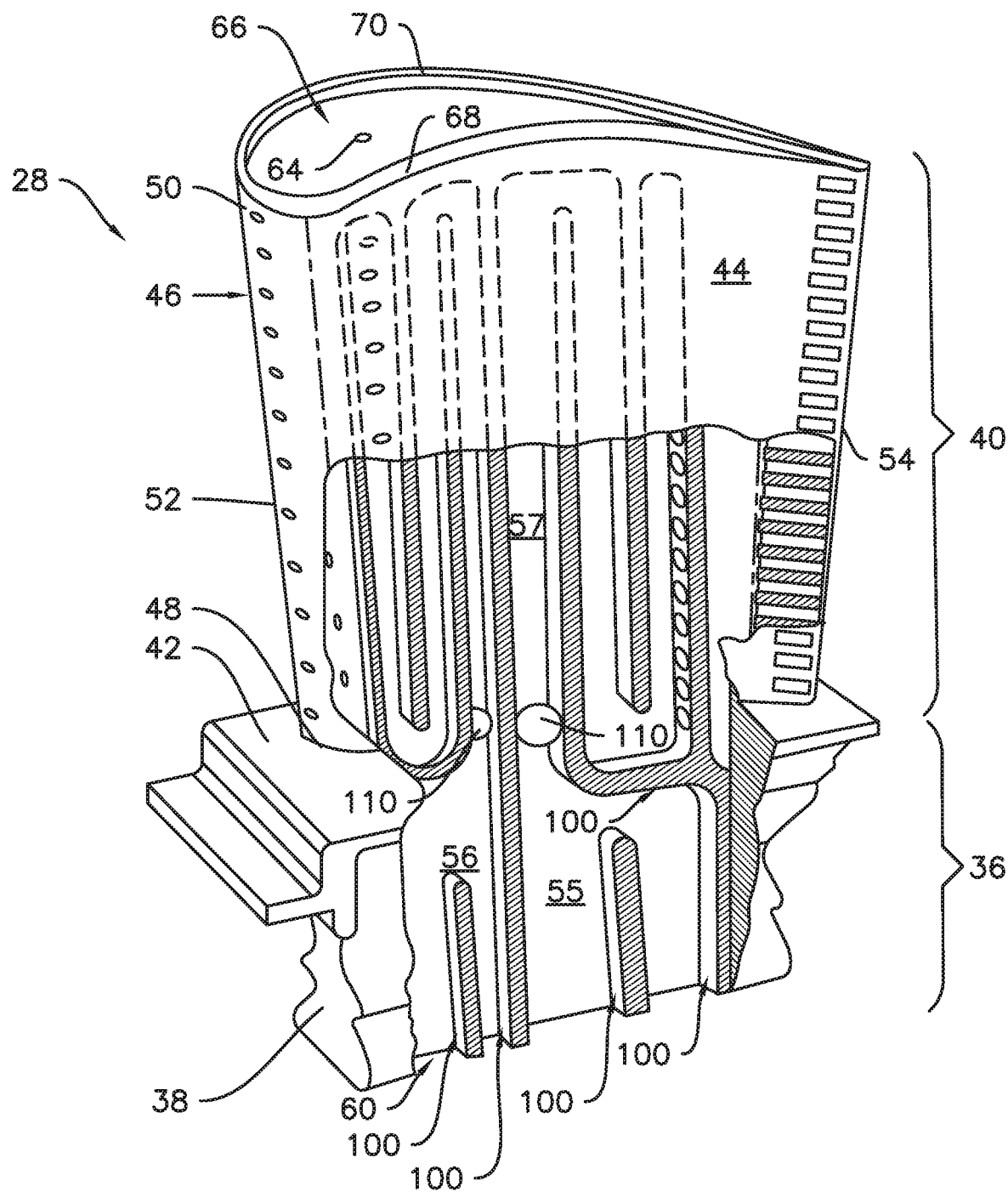
FIG. 3 is another view of the exemplary rotor blade of FIG. 2, wherein a mask has been applied within cooling passages thereof.

The present disclosure includes turbomachine components and methods of treating such components, e.g., methods of treating internal surfaces of turbomachine components. For example, the turbomachine component may be a rotor blade 28. FIGS. 2 and 3 provide perspective views of an exemplary rotor blade 28 according to one or more embodiments of the present invention. As shown in FIGS. 2 and 3, the rotor blade 28 generally includes a mounting or shank portion 36 having a mounting body 38 and an airfoil 40 that extends substantially radially outwardly from a substantially planar platform 42. The platform 42 generally serves as the radially inward boundary for the hot gases of combustion 34 flowing through the hot gas path 32 of the turbine section 18 (FIG. 1). As shown in FIGS. 2 and 3, the mounting body 38 of the mounting or shank portion 36 may extend radially inwardly from the platform 42 and may include a root structure, such as a dovetail, configured to interconnect or secure the rotor blade 28 to the rotor disk 26 (FIG. 1).

The airfoil 40 includes a pressure side wall 44 and an opposing suction side wall 46. The pressure side wall 44 and the suction side wall 46 extend substantially radially outwardly from the platform 42 in span from a root 48 of the airfoil 40 which may be defined at an intersection between the airfoil 40 and the platform 42, and a tip 50 of the airfoil 40. The airfoil 40 extends between a leading edge 52 of the airfoil 40 and a trailing edge 54 downstream of the leading edge 52. The pressure side wall 44 generally comprises an aerodynamic, concave external surface of the airfoil 40. Similarly, the suction side wall 46 may generally define an aerodynamic, convex external surface of the airfoil 40. The tip 50 is disposed radially opposite the root 48. As such, the tip 50 may generally define the radially outermost portion of the rotor blade 28 and, thus, may be configured to be positioned adjacent to a stationary shroud or seal (not shown) of the gas turbine 10. The tip 50 may include a tip cavity 66.

As shown in FIGS. 2 and 3, the rotor blade 28 may be at least partially hollow, e.g., a plurality of cooling passages 56

(shown partially in dashed lines in FIGS. 2 and 3) may be circumscribed within the airfoil 40 for routing a coolant 58 (FIG. 2) through the airfoil 40 between the pressure side wall 44 and the suction side wall 46, thus providing convective cooling thereto. The coolant 58 may include a portion of the compressed air from the compressor section 14 (FIG. 1) and/or steam or any other suitable gas or other fluid for cooling the airfoil 40. One or more cooling passage inlets 60 are disposed along the rotor blade 28. In some embodiments, one or more cooling passage inlets 60 are formed within, along or by the mounting body 38. The cooling passage inlets 60 are in fluid communication with at least one corresponding cooling passage 56. A plurality of coolant outlets 64 may be in fluid communication with the tip cavity 66. Each cooling passage 56 is in fluid communication with at least one of the coolant outlets 64. In some embodiments, the tip cavity 66 may be at least partially surrounded by a pressure side tip rail 68 and a suction side tip rail 70.

As may be seen in FIGS. 2 and 3, the cooling passages 56 extend within each of the shank portion 36 and the airfoil portion 40. For example, the cooling passages 56 may extend between the shank portion 36 and the airfoil portion 40, e.g., from the shank portion 36 to the airfoil portion 40, such as from the one or more cooling passage inlets 60 in the shank portion 36 to the at least one coolant outlets 64 in the tip 50 of the airfoil portion 40. As such, each cooling passage 56 may include a first or radially inner portion 55 within the shank portion 56 and a second or radially outer portion 57 within the airfoil portion 40 of the rotor blade 28.

As best seen in FIG. 3, the cooling passages 56 may include a plurality of internal surfaces 100. As will be described in more detail below, such internal surfaces 100 may be treated, such as by applying a coating to the internal surfaces 100 and/or peening the internal surfaces 100.

Figure 4:
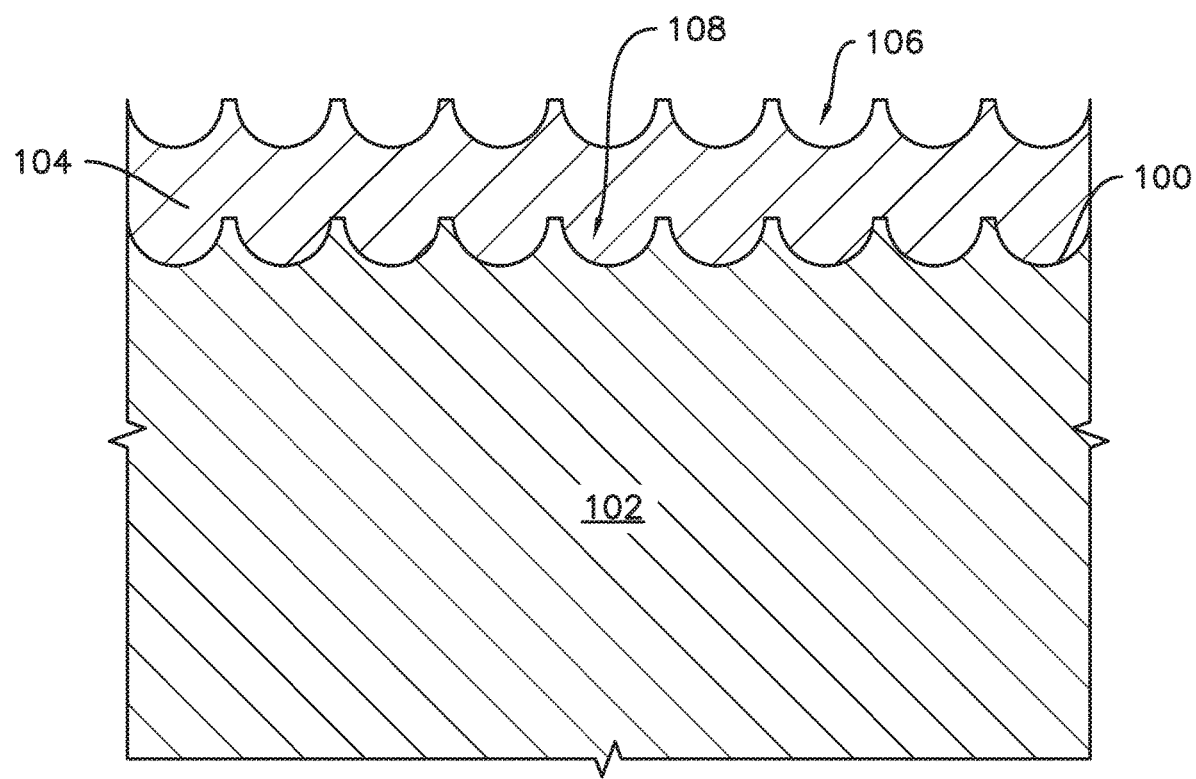
FIG. 4 is an enlarged section view of a substrate and a coating on the substrate according to one or more embodiments of the present disclosure.

In some embodiments, for example as illustrated in FIG. 4, the rotor blade 28 may include a substrate 102 and the internal surface 100 may be a surface of the substrate 102. As shown in FIG. 4, a coating 104 may be applied to the substrate 102, such as on the internal surface 100 thereof. The coating 104 may be, e.g., a diffusion aluminide coating which can be applied using chemical vapor deposition techniques such as pack cementation. Also as may be seen in FIG. 4, the component, e.g., rotor blade 28, may be peened. As is generally understood by those of skill in the art, peening includes directing or impinging a peening force, such as an impact force from a peening media, onto a workpiece or component, e.g., the rotor blade 28. Peening generally imparts a force to the component to plastically deform the component and produce a compressive stress yield at the desired location or area in the component. The plastic deformation produces strain hardening and compressive residual stresses in the surface, e.g., surface 100, of the component. For example, peening may include shot peening, where the peening force is an impact force of peening media such as shot, e.g., round generally spherical balls of metal. In other examples, peening may impart the force without the use of such media.

The impact of the peening media may create an array of slight indents in the surface of the component. For example, FIG. 4 illustrates a portion of a component wherein a peening media has been directed onto the coating 104, forming indents 106 in the coating 104. As shown in FIG. 4 for purposes of illustration, the indents 106 are hemispherical, such as may be created by a shot peening media including spherical balls. However, this shape of the indents 106 is depicted for illustrative purposes only and the scale of the indents 106 may be exaggerated for clarity of illustration. In practice, the indents 106 may be relatively smaller, e.g., relative to the thickness of the coating 104, and may include different shapes such as round shapes including portions of a sphere less than half of a sphere or other shapes, e.g., including linear or faceted shapes.

The impact of the peening media on the coating 104 may be transferred through the coating 104 to the substrate 102. For example, as shown in FIG. 4, an array of indents 108 may be formed in the substrate 102 as a result of the peening on the coating 104. Accordingly, the substrate 102 may exhibit residual compressive stress from the peening. The residual stress from peening may be exhibited by structural features such as indents 108, or, as another example, residual compressive stress from the peening may be indicated in the substrate by grain misorientation within a crystal lattice of the substrate, e.g., where the substrate 102 is a metallic material. Such grain misorientation may, for example, be identified by microscopic examination of the component, such as electron backscatter diffraction (EBSD). Similar to the indents 106, the indents 108 as depicted in FIG. 4 are shown for illustrative purposes only and may vary in size and/or shape in practice.

Figure 5:
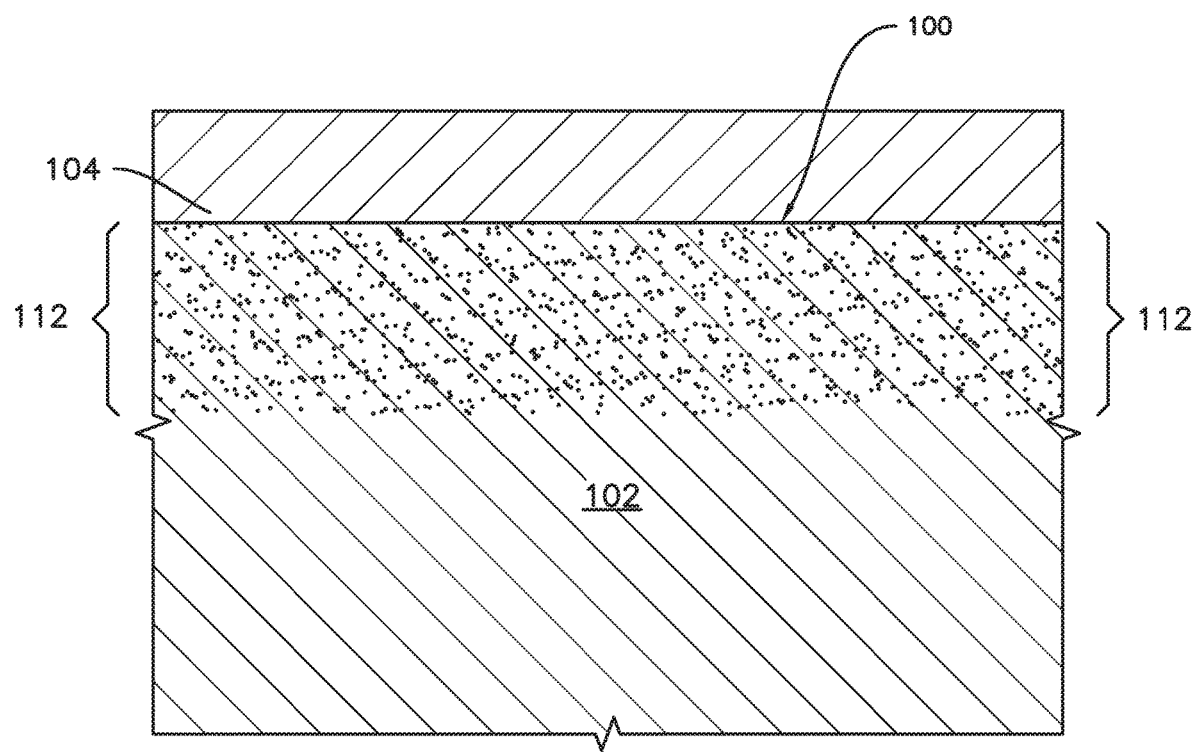
FIG. 5 is an enlarged section view of a substrate and a coating on the substrate according to one or more additional embodiments of the present disclosure.

In some embodiments, for example as illustrated in FIG. 5, the coating 104 and/or substrate 102 may not exhibit readily observable macro-scale effects of peening, e.g., the indents 106 and/or 108 depicted in FIG. 4 may not be present. For example, as mentioned above, the component may be peened without using a peening media. Additional exemplary peening processes which may be used in accordance with the present disclosure include, but are not limited to, water cavitation peening, explosion forming, and laser peening. In such embodiments, the peening force, e.g., from the laser or cavitating water, etc., may be transferred through the coating 104 to the substrate 102 more broadly, e.g., over a wider area, such that discrete localized surface deformations such as the indents 106 and 108 may not be present. In the absence of such surface features, the component may not be expected to show residual stress from peening. For example, the component may not appear on initial observation, e.g., with the naked eye, to exhibit residual stress or other effects of peening. However, in such cases the substrate 102 may exhibit residual compressive stress from the peening by, for example, grain misorientation within a crystal lattice of the substrate, as described above, even in the absence of indents 106 and/or 108 or in the presence of minimal indents. Such grain misorientation may, for example, be identified by microscopic examination of the component, such as electron backscatter diffraction (EBSD). For example, the grain misorientation may be observable within an impact zone 112 in the substrate 102 proximate the surface 100.

In various embodiments, the present disclosure may include one or more methods of treating a turbomachine component, such as treating a substrate of the turbomachine component. Examples of such methods are illustrated by the flow diagrams in FIGS. 6 and 7.

Figure 6:
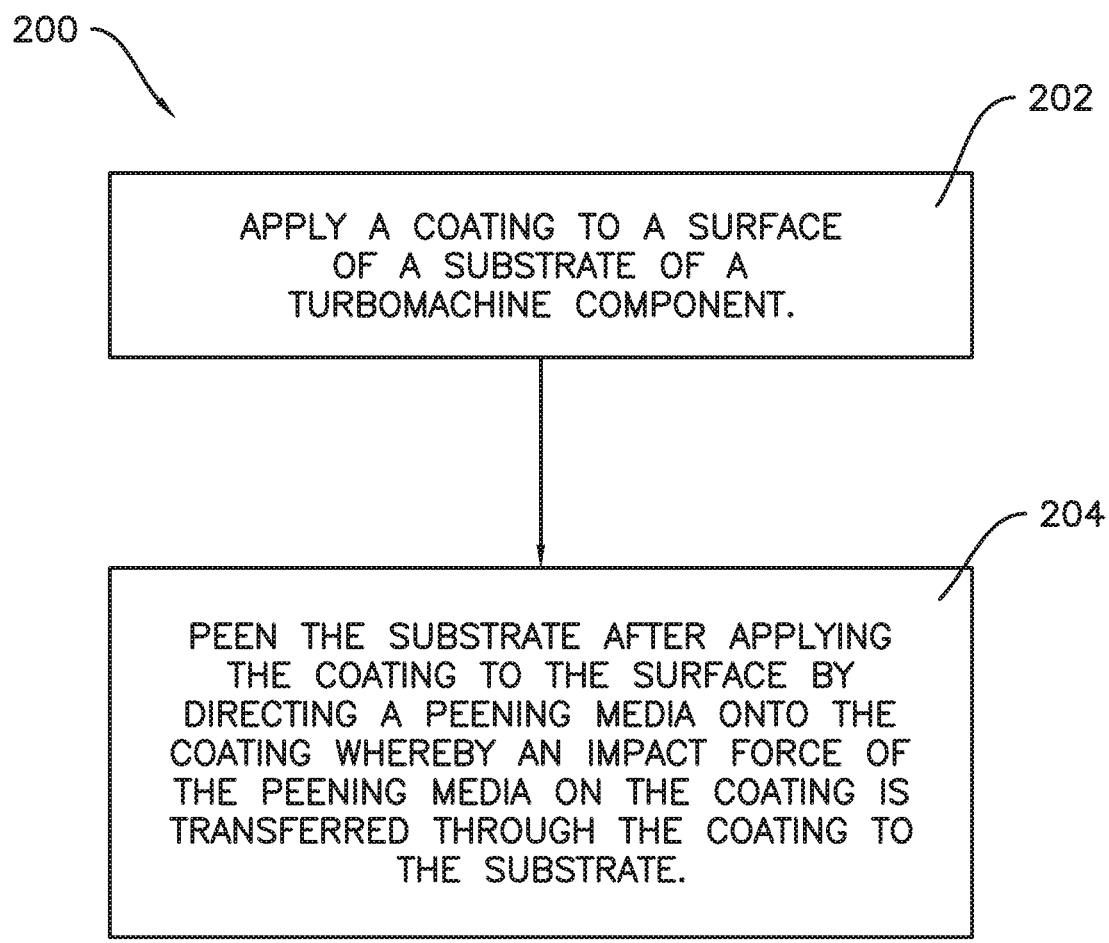
FIG. 6 provides a flow chart illustrating an example method of treating a turbomachine component according to one or more exemplary embodiments of the present disclosure.

For example, FIG. 6 illustrates a method 200 of treating a substrate of a turbomachine component. The method 200 includes a coating step 202 of applying a coating to a surface of the substrate of the turbomachine component. In some embodiments, the coating and the substrate in step 202 may, for example, be the coating 104 and the substrate 102 shown in FIG. 4 or FIG. 5 and described above.

For example, the substrate may be a substrate of a turbomachine component such as the rotor blade 28, and the component may be hollow, e.g., may include one or more internal cavities, such as cooling passages 56. In such embodiments, the surface may be an internal surface, for example, the internal surfaces 100 of the cooling passages shown in FIG. 3.

As shown in FIG. 6, the method 200 may further include a peening step 204 after the coating step 202. The peening step 204 may include directing a peening force, e.g., an impact force of a peening media, onto the coating such that the peening force on the coating is transferred through the coating to the substrate. As will be understood, in order to transfer the peening force through the coating, e.g., coating 104 of FIG. 4 or FIG. 5, the coating is sufficiently resilient (e.g., not brittle) to avoid or minimize damage, e.g., spalling, to the coating during peening, without being so ductile that the peen energy, e.g., the impact force of the peening media, is absorbed by the coating without inducing the beneficial compressive stress in the substrate.

Figure 7:
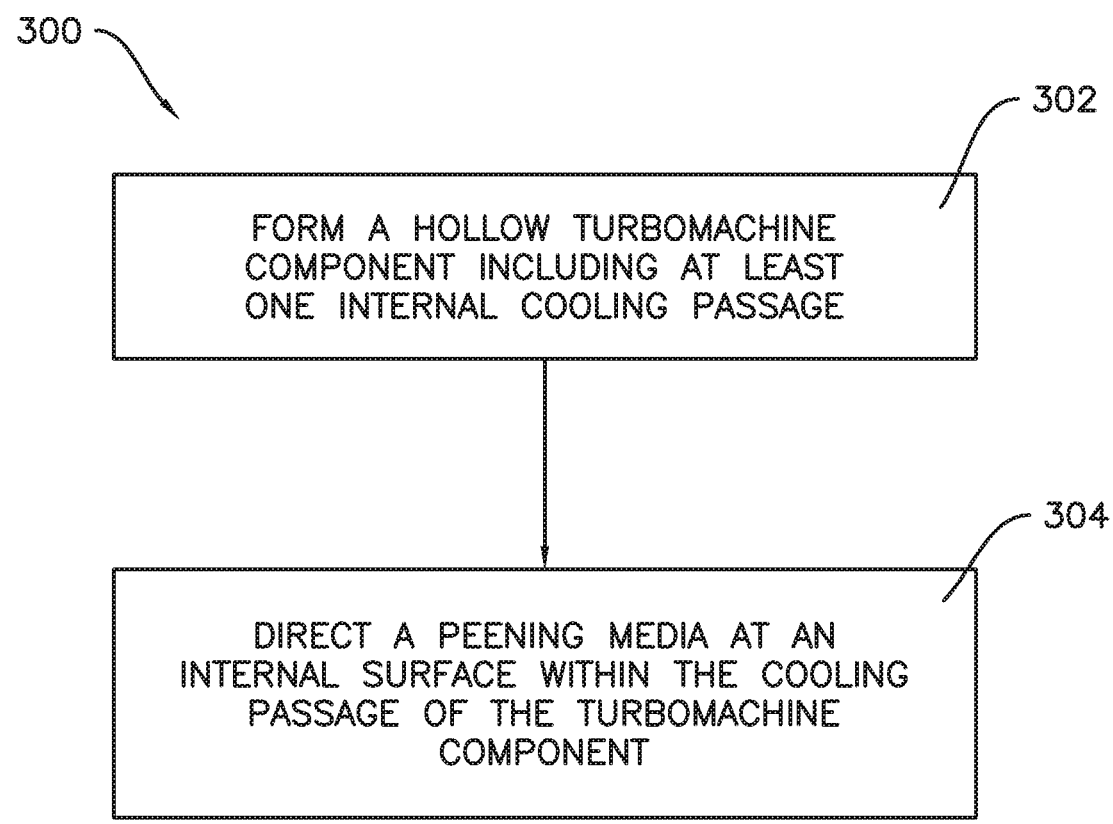
FIG. 7 provides a flow chart illustrating another example method of treating a turbomachine component according to one or more additional exemplary embodiments of the present disclosure.

FIG. 7 illustrates another exemplary method 300 of treating a turbomachine component. As illustrated for example in FIG. 7, the method 300 may include a step 302 of forming a hollow turbomachine component including at least one internal cooling passage. In some embodiments, the hollow turbomachine component may be formed by investment casting. The particular steps of investment casting are understood by those of skill in the art. The method 300 may further include a peening step 304, which may include directing a peening force, such as an impact force of a peening media, at an internal surface of the cooling passage of the turbomachine component.

In some embodiments, the turbomachine component may include a substrate, the internal surface may be a surface of the substrate, and the method 300 may also include a step of applying a coating to the internal surface prior to directing the peening force at the internal surface, similar to step 202 of method 200 described above. In such embodiments, the peening force may be directed onto the coating such that the peening force on the coating is transferred through the coating to the substrate.

In various embodiments, the peening step 204 of method 200 and/or the peening step 304 of method 300 may include shot peening, e.g., the peening force may be an impact force of a peening media and the peening media may include shot. In such embodiments, directed the peening force at the internal surface may include directing the peening media at the internal surface and onto the coating, e.g., using a lance to direct the peening media at the internal surface and onto the coating. The structure and operation of such lances are generally understood by those of skill in the art and, as such, are not shown or described in further detail herein for the sake of clarity and concision.

In some embodiments, applying a coating to the internal surface prior to peening may include applying an aluminide material to the internal surface to form a diffusion aluminide coating on the substrate. Applying the coating may also include heating the substrate. For example, in embodiments where the coating includes an aluminide material, the diffusion aluminide coating may be formed by chemical vapor deposition, such as pack cementation. As is generally understood by those of skill in the art, such techniques include heating the substrate. For example, pack cementation may include heating the substrate to temperatures from about eight hundred degrees Celsius (800° C.) to about one thousand two hundred degrees Celsius (1,200° C.) or higher. Those of skill in the art will recognize that such temperatures may relax any residual stress in the substrate from any peening which is performed prior to coating. Accordingly, exemplary embodiments of the present subject matter include peening the component after applying the coating.

In some embodiments, the method 200 and/or the method 300 may include applying a mask 110 (FIG. 3) within the cooling passage 56 prior to peening the internal surface 100 of the cooling passage 56. The mask 110 may be applied between the radially inner portion 55 of the cooling passage 56 within the shank portion 36 of the rotor blade 28 and the radially outer portion 57 within the airfoil portion 40 of the rotor blade 28, such as at a location approximately radially aligned with the platform 42, as illustrated in FIG. 3. For example, in embodiments where peening includes use of a peening media to provide an impact force to the coating and/or substrate, with the mask 110 in place, peening media may be obstructed by the mask 110 from entering the radially outer portion 57 of the cooling passage 56 within the airfoil portion 40 of the rotor blade 28 during peening. After peening, the mask 110 may be removed. For example, in some embodiments, the mask 110 may include a material which can be injected and subsequently removed, e.g., melted or burned out, after peening, such as a room temperature vulcanizing silicone (RTV) or a wax. In other example embodiments, the mask 110 may be removed by other methods. For example, any other suitable material may be used for the mask 110, including epoxy or water soluble polymers or ceramics. In such embodiments, the mask 110 may be removed by dissolving the mask 110. In various embodiments, the mask 110 may be used in combination with a non-media peening process, e.g., water cavitation peening as discussed above, or peen media may be used without the mask 110, among other variations and combination of features within the scope of the present disclosure.

Turning again to FIGS. 2 and 3, the rotor blade 28 illustrated therein is one example of a turbomachine component which may be treated according to one or more of the above-described methods. Other turbomachine components may also be treated according to one or more of the above-described methods. As a result of such treatment, the component, including a substrate thereof, such as the substrate 102 illustrated in FIGS. 4 and 5 and described above, may exhibit residual compressive stress from peening. The component may include any material that may benefit from hardening, such as aluminum alloys, titanium alloys, nickel base super alloys, cast irons, other iron alloys, and virtually any metal component having notches, holes, corners, or other features prone to fatigue failure. For example, the component, e.g., rotor blade 28, may include a superalloy material and/or a single crystal material, e.g., a material with minimal or no internal grain boundaries. For example, the substrate of the component may include the superalloy material and/or single crystal material. Examples of such materials may include nickel or cobalt based superalloys, such as high performance nickel-based superalloys such as GTD-111™, GTD-444™, RENE N5®, R108™, INCONEL™ 738, or single crystal N4 and N5.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. A method of treating a substrate of a rotor blade for a turbomachine, the method comprising:
applying a coating to a surface of the substrate of the rotor blade, wherein the rotor blade is hollow and the surface is an internal surface of a cooling passage of the rotor blade;
applying a mask within the cooling passage at a location generally radially aligned with a platform of the rotor blade; and
peening the internal surface of the rotor blade after applying the coating to the internal surface by directing a peening force onto the coating whereby the peening force on the coating is transferred through the coating to the substrate and whereby the substrate exhibits residual compressive stress from the peening force transferred through the coating to the substrate, wherein the peening force is an impact force of a peening media, whereby the peening media is obstructed by the mask from entering a portion of the cooling passage within an airfoil portion of the rotor blade during peening, wherein peening the substrate comprises shot peening the substrate using a lance to direct the peening media onto the coating.

2. The method of claim 1, wherein the rotor blade comprises a shank portion that extends radially inward from the platform, wherein an airfoil portion extends radially outward from the platform, and wherein the cooling passage extends within the shank portion, the airfoil portion, and the platform.

3. The method of claim 2, further comprising removing the mask after peening.

4. The method of claim 1, wherein applying the coating comprises heating the substrate.

5. The method of claim 1, wherein applying the coating comprises applying an aluminide material to the substrate to form a diffusion aluminide coating.

6. The method of claim 1, wherein applying the coating comprises applying the coating by chemical vapor deposition.

7. The method as in claim 1, wherein an array of indents are formed in the substrate as a result of peening on the coating, and wherein no indents are formed on the coating as a result of peening on the coating.

8. The method as in claim 1, wherein the applying the mask step is after the applying the coating step and prior to the peening step.

9. The method as in claim 1, wherein the substrate comprises a superalloy material.

10. The method as in claim 1, wherein applying the coating comprises heating the substrate to between about 800° C. to about 1,200° C.

11. The method as in claim 1, wherein both the coating and the substrate do not exhibit readily observable effects of peening after the peening step.

12. The method of claim 1, wherein the peening step results in a crystal lattice of the substrate exhibiting a grain misorientation, and wherein the grain misorientation is not observable to a naked eye.

13. The method as in claim 12, further comprising identifying, by microscopic examination of the rotor blade using electron backscatter diffraction, the grain misorientation in an impact zone of the substrate.

14. A method of treating a rotor blade for a turbomachine, the method comprising:
applying a mask within a cooling passage defined within the rotor blade at a location generally radially aligned with a platform of the rotor blade;
directing a peening force at a coating on an internal surface of the cooling passage; and
whereby the peening force is transferred through the coating to the internal surface and whereby the internal surface exhibits residual compressive stress from the peening force transferred through the coating, wherein the peening force is an impact force of a peening media on the coating, and wherein the peening media comprises shot and directing the peening force at the coating on the internal surface comprises directing the peening media at the internal surface using a lance, whereby the peening media is obstructed by the mask from contacting a portion of the cooling passage within the airfoil portion of the rotor blade while directing the peening media at the coating on the internal surface.

15. The method of claim 14, wherein the rotor blade comprises a substrate and the internal surface is a surface of the substrate.

16. The method of claim 15, wherein applying the coating comprises applying an aluminide material to the substrate to form a diffusion aluminide coating.

17. The method of claim 15, wherein applying the coating comprises applying the coating by chemical vapor deposition.

18. The method of claim 14, wherein the rotor blade comprises a shank portion extending radially inward from the platform, wherein the airfoil portion extends radially outward from the platform, the cooling passage extending within the shank portion, the airfoil portion, and the platform, wherein the peening force is an impact force of a peening media directed at the coating on the internal surface.

19. The method of claim 18, wherein the mask is one of a room temperature vulcanizing silicone or a wax, wherein the mask is injected into the rotor blade during the applying step, and wherein the method further comprises removing the mask after directing the peening media at the coating on the internal surface.

20. The method as in claim 14, wherein the peening step is performed by one of water cavitation peening, laser peening, or explosion forming.

* * * * *